United States Patent
Yamamoto

(10) Patent No.: US 7,352,412 B2
(45) Date of Patent: Apr. 1, 2008

(54) MINIATURIZED TELEVISION TUNER AND TELEVISION RECEIVER INCLUDING THE SAME

(75) Inventor: Masaki Yamamoto, Tokyo (JP)

(73) Assignee: Alps Electric Co., Ltd, Tokyo (JP)

( * ) Notice: Subject to any disclaimer, the term of this patent is extended or adjusted under 35 U.S.C. 154(b) by 485 days.

(21) Appl. No.: 11/136,208

(22) Filed: May 24, 2005

(65) Prior Publication Data

US 2005/0260960 A1    Nov. 24, 2005

(30) Foreign Application Priority Data

May 28, 2004  (JP) .......................... 2004-003034 U

(51) Int. Cl.
*H04N 5/50*   (2006.01)

(52) U.S. Cl. .................. 348/731; 348/733; 455/182.2; 455/184.1

(58) Field of Classification Search ........ 348/731–733, 348/725, 726, 730; 455/182.2, 182.1, 184.1, 455/196.1
See application file for complete search history.

(56) References Cited

U.S. PATENT DOCUMENTS

| 4,268,862 | A | * | 5/1981 | Sasaki ......................... 348/735 |
| 5,233,425 | A | * | 8/1993 | Rabii .......................... 348/735 |
| 5,940,143 | A | * | 8/1999 | Igarashi et al. ............. 348/678 |

FOREIGN PATENT DOCUMENTS

| JP | A1 11-298353 | 10/1999 |
| JP | A2 2003-78431 | 3/2003 |

* cited by examiner

*Primary Examiner*—M. Lee
(74) *Attorney, Agent, or Firm*—Brinks Hofer Gilson & Lione

(57) ABSTRACT

A television tuner includes an IF output terminal for outputting an IF signal converted from a received television signal to an external source, and a channel-selection PLL circuit for converting a high voltage supplied from an external source to a tuning voltage and for supplying the tuning voltage to an internal tuned circuit. The IF output terminal and a high-voltage input terminal of the channel-selection PLL circuit are connected to each other via a first resistor.

4 Claims, 2 Drawing Sheets

MINIATURIZED TELEVISION TUNER AND TELEVISION RECEIVER INCLUDING THE SAME

This application claims the benefit of priority to Japanese Patent Application No. 2004-003034 filed on May 28, 2004, herein incorporated by reference.

BACKGROUND OF THE INVENTION

1. Field of the Invention

The present invention relates to a television tuner and a television receiver including the television tuner.

2. Description of the Related Art

A typical known television tuner (for example, the tuner disclosed in Japanese Unexamined Patent Application Publication No. 11-298353 (FIG. 3)) is described below with reference to FIG. 2. An ultra high frequency (UHF) circuit system 21 includes an input tuned circuit 22 connected to an antenna input terminal 11, a radio frequency (RF) amplifier circuit 23 connected to the output of the input tuned circuit 22, an interstage tuned circuit 24 connected to the output of the RF amplifier circuit 23, and a mixer circuit 25 connected between the output of the interstage tuned circuit 24 and the output of an oscillating (OSC) circuit 26. A very high frequency (VHF) circuit system 31 includes an input tuned circuit 32 connected to the antenna input terminal 11, an RF amplifier circuit 33 connected to the output of the input tuned circuit 32, an interstage tuned circuit 34 connected to the output of the RF amplifier circuit 33, and a mixer circuit 35 connected between the output of the interstage tuned circuit 34 and an output of an OSC circuit 36.

A power supply voltage is supplied to the UHF circuit system 21 from a UHF supply terminal 14, while a power supply voltage is supplied to the VHF circuit system 31 from a VHF supply terminal 13.

The outputs from the mixer circuits 25 and 35 are connected to an intermediate frequency (IF) amplifier 12, and the output from the IF amplifier 12 is connected to an IF output terminal 16. A tuning voltage input into a tuning terminal 15 is supplied to the OSC circuits 26 and 36, the input tuned circuits 22 and 32, and the interstage tuned circuits 24 and 34. A desired channel is selected by the input tuned circuits 22 and 32 and the interstage tuned circuits 24 and 34, and the resulting signals are converted into IF signals in the mixer circuits 25 and 35 by local oscillation signals from the OSC circuits 26 and 36, and the IF signal is output to the IF output terminal 16.

The tuning voltage is supplied to the tuning terminal 15 from a phase-locked loop (PLL) circuit (not shown). A voltage higher than the tuning voltage is supplied to the PLL circuit from the outside of the television tuner, and the PLL circuit converts this high voltage into a tuning voltage in accordance with the channel to be selected based on the channel selection signal.

In the above-described type of television tuner, in addition to the IF output terminal 16, the tuning terminal 15, the UHF supply terminal 14, the VHF supply terminal 13, and the terminal for receiving a high voltage (not shown), many other terminals are provided, thereby making it difficult to reduce the size of the television tuner.

SUMMARY OF THE INVENTION

Accordingly, it is an object of the present invention to reduce the size of a television tuner by decreasing the number of terminals and also to simplify the connection between the television tuner and a television receiver.

To solve the above-described problems, a television tuner of the present invention includes: an IF output terminal for outputting an IF signal converted from a received television signal to an external source; and a channel-selection PLL circuit for converting a high voltage supplied from an external source to a tuning voltage and for supplying the tuning voltage to an internal tuned circuit. The IF output terminal and a high-voltage input terminal of the channel-selection PLL circuit are connected to each other via a first resistor.

With this configuration, by applying the high voltage, which serves as the power supply of the tuning voltage, to the IF output terminal, the high voltage can be supplied to the PLL circuit without the need to dispose a dedicated terminal. Thus, the number of terminals can be decreased, thereby reducing the size of the television tuner.

A television receiver of the present invention includes: the aforementioned television tuner; a video IF circuit connected to the IF output terminal; and a power supply for outputting the high voltage to the IF output terminal.

With this configuration, the connection between the television tuner and the television receiver can be simplified.

In the aforementioned television receiver, the video IF circuit may include a SAW filter connected to the IF output terminal, and the high voltage is supplied to the IF output terminal via a second resistor.

With this arrangement, the impedance matching between the television tuner and the SAW filter can be provided because of the second resistor.

In the aforementioned television receiver, a terminal of the second resistor connected to the power supply is grounded via a capacitor.

With this arrangement, the influence of noise contained in the power supply on the IF signal can be prevented.

DESCRIPTION OF THE PREFERRED EMBODIMENTS

Figure 1:
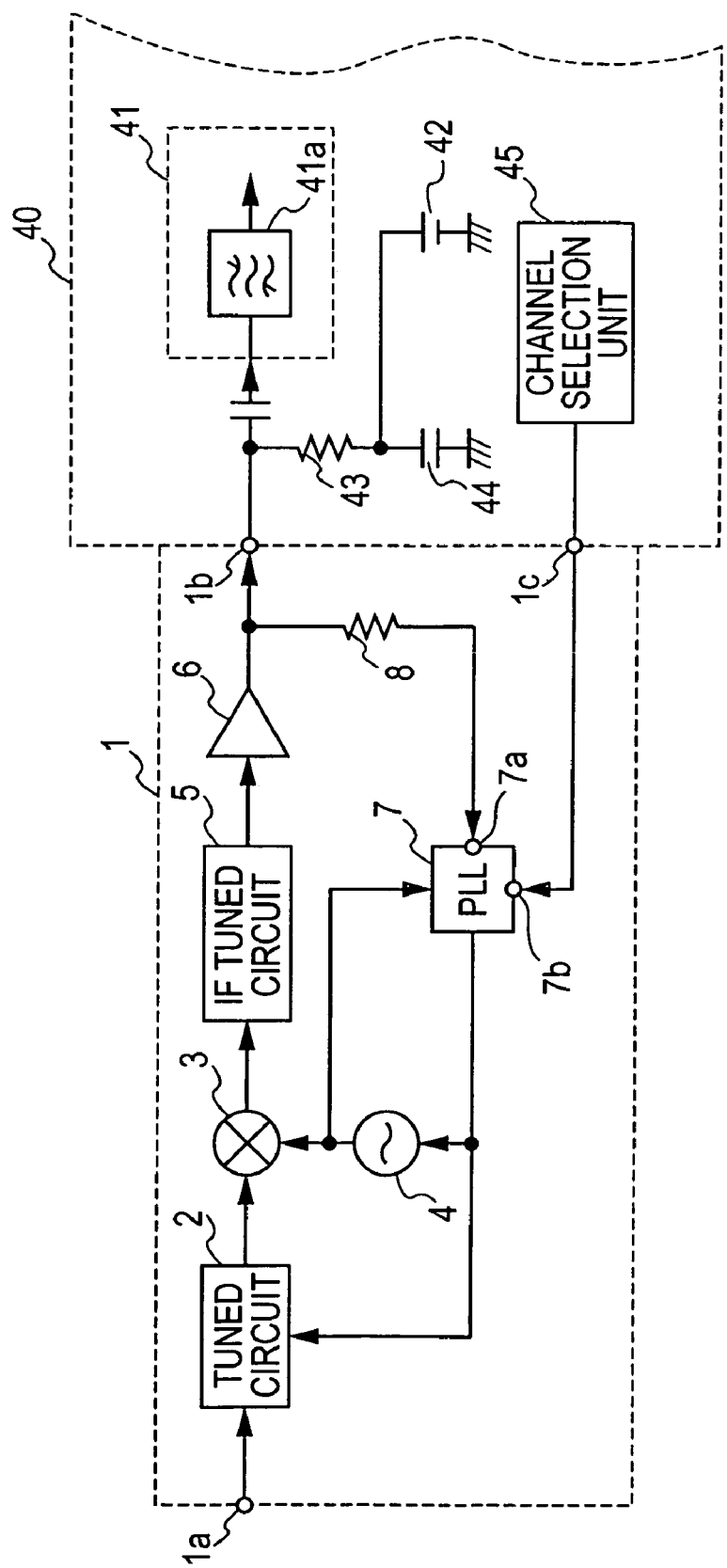
FIG. 1 is a circuit diagram illustrating the major configuration of a television tuner and a television receiver according to an embodiment of the present invention.
Figure 2:
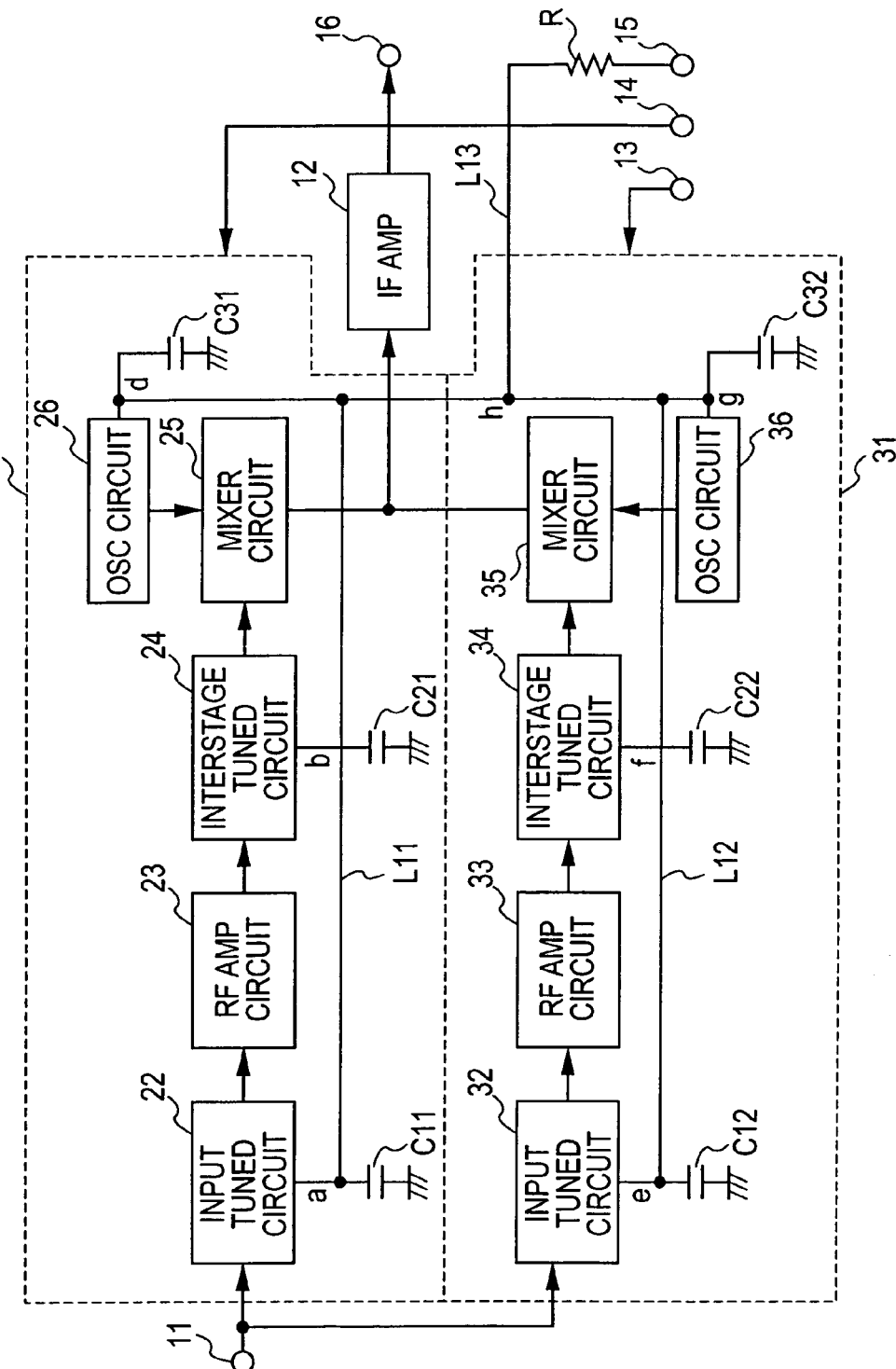
FIG. 2 is a circuit diagram illustrating the configuration of a known television tuner.

A television tuner 1 and a television receiver 40 according to an embodiment of the present invention are described below with reference to FIG. 1.

A television signal input into an input terminal 1a of the television tuner 1 is supplied to a tuned circuit 2, and a selected television signal is input into a mixer 3.

A local oscillation signal is supplied to the mixer 3 from an oscillator 4. The television signal is mixed with the local oscillation signal and is converted into an IF signal. The IF signal is supplied to an IF amplifier 6 via an IF tuned circuit 5 and the amplified IF signal is then output to an IF output terminal 1b.

A tuning voltage is supplied to the tuned circuit 2 and the oscillator 4 from a PLL circuit 7. This tuning voltage varies in a range from several volts to ten-odd volts in accordance with the frequency of a television signal to be received, and the tuned circuit 2 is tuned to the frequency of the television signal, and the oscillator 4 oscillates at a frequency required for converting the television signal into the IF frequency.

Accordingly, the local oscillation signal is input into the PLL circuit 7 from the oscillator 4.

A high voltage, which serves as the power supply of the tuning voltage, is required for the PLL circuit 7, and a high-voltage input terminal 7a to which the high voltage is input is connected to an IF output terminal 1b via a first resistor 8 having ten-odd kiloohms. Channel selection data for setting the tuning voltage is input into the PLL circuit 7, and a data input terminal 7b to which the channel selection data is input is connected to a channel selection terminal 1c.

A motherboard (not shown) to which the television tuner 1 is connected is disposed in the television receiver 40, and a video IF circuit 41 for processing the IF signal is disposed on the motherboard. A surface acoustic wave (SAW) filter 41a, which is provided at the first stage of the video IF circuit 41 is coupled to the IF output terminal 1b.

A power supply 42 for outputting a high voltage (about 30 volts) higher than the maximum of the tuning voltage is provided for the television receiver 40, and this high voltage is applied to the IF output terminal 1b via a second resistor 43. The terminal of the second resistor 43 connected to the power supply 42 is grounded via a capacitor 44. A channel selection unit 45 is provided for the television receiver 40, and channel selection data output from the channel selection unit 45 is input into the channel selection terminal 1c.

According to the above-described configuration, the high voltage output from the power supply 42 is input into the PLL circuit 7 via the IF output terminal 1b, thereby reducing the number of terminals specifically used for inputting the high voltage to the PLL circuit 7. Since the number of terminals of the television tuner 1 is smaller, the connection between the television tuner 1 and the television receiver 40 can be simplified.

Although the IF signal is superimposed on the high voltage, there is no interference therebetween since the high voltage is a DC voltage. Because of the presence of the first resistor 8, the leakage of the IF signal to the PLL circuit 7 can be prevented. By suitably selecting the resistance of the second resistor 43, the impedance matching between the IF amplifier 6 and the SAW filter 41a can be provided. Since the second resistor 43 and the capacitor 44 form a low-pass filter, noise components contained in the power supply 42 are not superimposed on the IF signal.

What is claimed is:

1. A television tuner comprising:
   An intermediate frequency output terminal for outputting an intermediate frequency signal converted from a received television signal to an external source; and
   a channel-selection phase-locked loop circuit for converting a high voltage supplied from an external source to a tuning voltage and for supplying the tuning voltage to an internal tuned circuit,
   wherein the intermediate frequency output terminal and a high-voltage input terminal of the channel-selection phase-locked loop circuit are connected to each other via a first resistor.

2. A television receiver comprising:
   the television tuner set forth in claim 1;
   a video intermediate frequency circuit connected to the intermediate frequency output terminal; and
   a power supply for outputting the high voltage to the intermediate frequency output terminal.

3. The television receiver according to claim 2, wherein the video intermediate frequency circuit includes a surface acoustic wave filter connected to the intermediate frequency output terminal, and the high voltage is supplied to the intermediate frequency output terminal via a second resistor.

4. The television receiver according to claim 3, wherein a terminal of the second resistor connected to the power supply is grounded via a capacitor.

* * * * *

UNITED STATES PATENT AND TRADEMARK OFFICE
CERTIFICATE OF CORRECTION

| | | |
|---|---|---|
| PATENT NO. | : 7,352,412 B2 | Page 1 of 1 |
| APPLICATION NO. | : 11/136208 | |
| DATED | : April 1, 2008 | |
| INVENTOR(S) | : Masaki Yamamoto | |

It is certified that error appears in the above-identified patent and that said Letters Patent is hereby corrected as shown below:

On the Title Page, Item (30)

"Foreign Application Priority Data", delete "May 28, 2004" and substitute --May 24, 2004-- in its place.

Signed and Sealed this

Twelfth Day of August, 2008

JON W. DUDAS
*Director of the United States Patent and Trademark Office*